(12) United States Patent
Callaghan et al.

(10) Patent No.: US 7,391,215 B2
(45) Date of Patent: Jun. 24, 2008

(54) NMR APPARATUS

(75) Inventors: Paul Terence Callaghan, Wellington (NZ); Mark Warwick Hunter, Wellington (NZ); Robin Dykstra, Palmerston North (NZ); Craig David Eccles, Wellington (NZ)

(73) Assignees: Victoria Link Limited, Kelburn, Wellington (NL); Massey University, Palmerston North (NL)

( * ) Notice: Subject to any disclaimer, the term of this patent is extended or adjusted under 35 U.S.C. 154(b) by 52 days.

(21) Appl. No.: 10/520,862

(22) PCT Filed: Jul. 11, 2003

(86) PCT No.: PCT/NZ03/00149

§ 371 (c)(1),
(2), (4) Date: Dec. 21, 2005

(87) PCT Pub. No.: WO2004/008168

PCT Pub. Date: Jan. 22, 2004

(65) Prior Publication Data

US 2006/0097725 A1  May 11, 2006

(30) Foreign Application Priority Data

Jul. 11, 2002  (NZ) ..................................... 520114

(51) Int. Cl.
 *G01V 3/00* (2006.01)
(52) U.S. Cl. ........................................ 324/319; 324/318
(58) Field of Classification Search ................. 324/319, 324/320, 318, 309, 307; 600/407, 410, 422
See application file for complete search history.

(56) References Cited

U.S. PATENT DOCUMENTS

| 4,498,048 | A | * | 2/1985 | Lee et al. ..................... 324/309 |
| 4,528,509 | A | | 7/1985 | Radda et al. |
| 4,538,130 | A | * | 8/1985 | Gluckstern et al. .......... 335/306 |
| 4,580,098 | A | * | 4/1986 | Gluckstern et al. .......... 324/307 |
| 4,710,713 | A | | 12/1987 | Strikman |
| 4,758,813 | A | * | 7/1988 | Holsinger et al. ........... 335/306 |

(Continued)

FOREIGN PATENT DOCUMENTS

EP  171931  3/1989

(Continued)

OTHER PUBLICATIONS

P.J. Prado, "NMR hand-held moisture sensor", Magnetic Resonance Imaging (pp. 505-508), (2001).

*Primary Examiner*—Brij B Shrivastav
(74) *Attorney, Agent, or Firm*—Dann, Dorfman, Herrell and Skillman, P.C.

(57) ABSTRACT

A magnetic assembly for a nuclear magnetic resonance apparatus includes a number of primary permanent magnets 1 disposed in an array about a longitudinal axis, the arrangement and/or characteristics of the plurality of magnets being such so as to create a zone of homogeneous magnetic field at some location along the axis forward of the array (and into the material when provided). A secondary permanent magnet 7 may be located along the longitudinal axis within the array of primary magnets and may be moveable. The primary magnets 1 have a north pole and a south pole with an axis therebetween, and may be arranged such that the axis between the poles is at an angle to the longitudinal axis.

23 Claims, 12 Drawing Sheets

U.S. PATENT DOCUMENTS

| | | | |
|---|---|---|---|
| 4,931,760 A * | 6/1990 | Yamaguchi et al. | 335/306 |
| 5,126,674 A | 6/1992 | Miller et al. | |
| 5,148,138 A | 9/1992 | Miyata | |
| 5,237,301 A | 8/1993 | Unkelbach et al. | |
| 5,390,673 A * | 2/1995 | Kikinis | 600/410 |
| 5,432,446 A | 7/1995 | MacInnis et al. | |
| 5,530,355 A | 6/1996 | Doty | |
| 5,646,528 A | 7/1997 | Hanley | |
| 5,660,744 A | 8/1997 | Sekine et al. | |
| 5,672,968 A | 9/1997 | Miller et al. | |
| 5,699,801 A | 12/1997 | Atalar et al. | |
| 5,739,688 A | 4/1998 | Krieg | |
| 5,900,793 A | 5/1999 | Katznelson et al. | |
| 5,959,454 A | 9/1999 | Westphal et al. | |
| 6,081,116 A | 6/2000 | Wu et al. | |
| 6,163,154 A | 12/2000 | Anderson et al. | |
| 6,278,351 B1 | 8/2001 | Wheatley | |
| 6,348,792 B1 | 2/2002 | Beard et al. | |
| 6,404,197 B1 | 6/2002 | Anderson et al. | |
| 6,489,767 B1 * | 12/2002 | Prado et al. | 324/318 |
| 6,489,872 B1 | 12/2002 | Fukushima et al. | |
| 6,657,433 B1 * | 12/2003 | Locatelli et al. | 324/318 |
| 6,828,892 B1 | 12/2004 | Fukushima et al. | |
| 2006/0097725 A1 * | 5/2006 | Callaghan et al. | 324/318 |
| 2006/0237652 A1 * | 10/2006 | Kimchy et al. | 250/363.02 |

FOREIGN PATENT DOCUMENTS

| | | |
|---|---|---|
| WO | 02056047 | 7/2002 |

* cited by examiner

NMR APPARATUS

FIELD OF THE INVENTION

The present invention relates to a magnetic assembly for a nuclear magnetic resonance spectroscopy apparatus. More particularly but not exclusively it relates to one-sided access nuclear magnetic resonance spectroscopy apparatus.

BACKGROUND TO THE INVENTION

This invention relates to the field of nuclear magnetic resonance (NMR) spectroscopic devices. NMR spectroscopy is an analytical and diagnostic technique that can be used for the structural and quantitative analysis of a compound in a mixture. NMR is based on the nuclear magnetic properties of certain elements and isotopes of those elements. It is based on the principle that nuclei with a non-zero spin will have a magnetic dipole and therefore will interact with electromagnetic (EM) radiation.

The presence or absence of a spin and the nature of this spin is expressed in terms of the spin quantum number of the nucleus, which may either be 0, ½ or multiples of ½.

In a uniform magnetic field a nucleus having a spin quantum number of ½ may assume two orientations relative to the applied magnetic field. The two orientations have different energies so that it is possible to induce a nuclear transition by the application of electromagnetic radiation of the appropriate frequency. This transition is resonance. Resonance arises when the correct combination of magnetic field strength and exciting frequency characteristics of the nuclei of interest are applied.

After resonance is achieved the NMR instrument records a signal, the signal being a function of the nature and amount of a compound of the test sample as well as nuclear magnetic relaxation considerations.

An NMR spectrometer generally comprises one or more magnets producing a strong homogenous field within a test region. The size and complexity of NMR spectrometers are largely a function of the magnetic field requirements.

Conventional NMR requires a laboratory electromagnet, or superconducting magnet. The spectroscopic information is obtained by using uniform magnetic fields and thus the technique is inherently invasive as the field uniformity is restricted to small volumes and materials must be placed inside the magnet system.

An alternative design is the "inside out" NMR which uses open magnet designs for measurements in the field without sample size restrictions. However a disadvantage of such a design is reduced sensitivity and lack of resolution and the field is less uniform than in such a magnetic configuration.

A development beyond the use of inside out NMR relates to the development of mobile NMR devices which have been developed for analysis of many things including oil wells, water reservoirs, plant growth and life cycles and moisture detection (for example in wood or concrete).

There are a number of difficulties associated with the development of small scale inside NMR apparatus. These include:

1) the homogeneity of the magnetic field;
2) it is important to provide a magnet with the highest field possible;
3) such a strong magnetic field generally requires larger, heavier magnets, which increases the costs of the spectrometer;
4) with such a magnet configuration typically only the surface area of a subject can be analysed by the technique.

A number of parties have applied themselves to these difficulties in the development of small scale NMR apparatus.

U.S. Pat. No. 6,163,154, (Anderson et al), discusses the development of small scale NMR apparatus for the measurement of a patient's glucose levels. It employs a pair of opposed permanent magnets and a plurality of annual circular magnets which are cancelling magnets.

U.S. Pat. No. 6,081,116, (Wu et al), deals with NMR apparatus for geological applications and employs a plurality of cylindrical magnets to approximate a permanent ring magnet. This will reduce the cost of the use of a single ring magnet.

U.S. Pat. No. 5,959,454, (Westphal et al), deals with the magnet arrangement for an NMR tomography system for skin and surface examinations. This is a one sided NMR system having two ring magnets and a cylindrical magnet the locations being so as to impart a certain degree of uniformity.

A number of people have alternatively attempted to deal with the problem that in one sided NMR, often only the surface region of the sample is analysable due to magnetic field concerns.

U.S. Pat. No. 5,739,688, (Krieg), attempts to profile in the z-axis direction (into the sample), by employing a static magnetic field having a predetermined inhomogeneity in the z direction. It uses slices perpendicular to the direction of inhomogeneity (z axis) with operating the apparatus by a pulse sequence with shortened measurement time. This allows for excitation of one slice independent of another, and overcomes relaxation disadvantages.

U.S. Pat. No. 5,126,674, (Miller et al), again deals with a one sided NMR apparatus and the technique of planar imaging. It creates an inhomogeneous magnetic field and the RF frequency selection excites only one "volume of interest" at a time. Again there is no need for relaxation as each is excited independently of the other.

U.S. Pat. No. 4,528,509, (Radda et al), and U.S. Pat. No. 4,710,713, (Strikman), both similarly deal with three dimension imaging via a homogenous field in the z-axis direction.

OBJECT OF THE INVENTION

It is an object of the present invention to provide a magnetic assembly for an NMR apparatus, or an NMR apparatus, which overcomes or at least ameliorates some of the abovementioned disadvantages; or which at least provides the public with a useful choice.

Other objects of the invention may become apparent from the following description which is given by way of example only.

SUMMARY OF THE INVENTION

In accordance with a first aspect of the present invention, there is provided a magnetic assembly for an NMR apparatus, including a plurality of primary permanent magnets disposed in an array about an axis (hereafter "longitudinal axis"), the arrangement and/or characteristics of the plurality of magnets being such so as to create a zone of homogeneous magnetic field at some location along the axis forward of the array (and into the material when provided).

The assembly may include a secondary permanent magnet located along the longitudinal axis, at least partly within the array of primary magnets.

Advantageously, the position of the secondary permanent magnet is adjustable along the longitudinal axis relative to the primary magnets.

The secondary magnet may be a cylindrical bar magnet.

Preferably, each of the primary magnets has a north and a south pole with an axis extending therebetween, and the primary magnets are arranged such that their axes are oriented at a non-parallel angle to the longitudinal axis of the assembly. Each of the plurality of primary magnets may be a cylindrical bar magnet, each having a proximal end at a front of the array, and a distal end at a rear of the array.

In a preferred embodiment, each of the plurality of primary magnets is tilted at an angle relative to the longitudinal axis, such that the configuration of magnets is in a substantially symmetrical tapered arrangement. The tapered arrangement is preferably according to the expression:

$$R = r|\cos\beta|\sqrt{1 + \frac{1}{\tan^2\frac{\pi}{N}\cos^2\beta}} + |l\sin\beta|$$

$$t = \sqrt{r^2 + \left(\frac{l}{2}\right)^2} \max(|\cos(\beta - \phi)|, |\cos(\beta + \phi)|)$$

where $$\phi = \tan^{-1}\left(\frac{2r}{l}\right)$$

N is the number of magnets used,
r is the radius of the magnets,
l is the length of the magnets,
β is the 'cone angle',
R is the 'ring radius',
and t is the distance along the longitudinal axis from the front of the array to the geometric centre of the magnets.

The proximal end of each of the plurality of primary magnets may be tilted through an angle beta towards the longitudinal axis, such that the configuration of primary magnets is in a substantially symmetrical tapered arrangement, tapering towards the front of the array. Alternatively, the proximal end of each of the plurality of primary magnets may be tilted through an angle beta away from the longitudinal axis, such that the configuration of primary magnets is in a substantially symmetrical tapered arrangement, tapering away from the front of the array.

The plurality of primary magnets is suitably disposed substantially symmetrically about the longitudinal axis.

The primary magnets may be as close together as is physically or reasonably possible.

Each of the plurality of primary magnets is preferably substantially identical. In the embodiment including a secondary permanent magnet located along the longitudinal axis, at least partly within the array of primary magnets, the secondary magnet is advantageously of substantially identical dimensions to each of the plurality of primary magnets. Each of the plurality of primary magnets and the secondary magnet may be a cylindrical bar magnet having a radius of about 1.8 cm and a length of about 5 cm.

The assembly preferably has 8 primary magnets.

The nature of the magnets and their relationship to the axis and any intended sample and/or the remainder of the apparatus is preferably as substantially as herein described.

In accordance with a second aspect of the present invention, there is provided a nuclear magnetic resonance apparatus for one sided access investigations of a material, including a magnetic assembly according to the first aspect above.

The nuclear magnetic resonance apparatus is preferably portable.

The apparatus is advantageously operable to provide investigations into a sample at up to about 10 cm.

The apparatus is preferably operable in such a fashion as to allow excitation of one volume $V_a$ of the material, being one of a plurality of volumes $V_1$ to $V_n$ existing as slices along the longitudinal axis. Preferably, the apparatus is operable to, following excitation of $V_a$ then allow excitation of a second volume $V_b$ being one of the plurality of volumes $V_1$ to $V_n$ substantially immediately after excitation of $V_a$.

In accordance with a third aspect of the present invention, there is provided a nuclear magnetic resonance apparatus for one sided access investigations of a material, including a plurality of primary permanent magnets disposed in an array about an axis (hereafter "longitudinal axis"), and a secondary permanent magnet located along the longitudinal axis, at least partly within the array of primary magnets, the position of the secondary permanent magnet being adjustable along the longitudinal axis relative to the primary magnets, the arrangement and/or characteristics of the magnets being such so as to create a zone of homogeneous magnetic field at some location along the axis forward of the array (and into the material when provided).

In accordance with a fourth aspect of the present invention, there is provided a method of studying the magnetic resonance of a material including the steps of:

a) employing the NMR apparatus according to the second or third aspect above;
b) generating a sufficiently homogeneous magnetic field over a volume $V_a$ located at a location along the longitudinal axis in the material thereby causing excitation of subject nuclei in the volume $V_a$; and
c) detecting radio frequency emissions from the subject nuclei in the volume $V_a$.

The method preferably comprises or includes, subsequent to step c):

d) substantially immediately following excitation of volume $V_a$, causing excitation of subject nuclei in a volume $V_b$, wherein $V_b$ is a volume differing from $V_a$ only in its position along the longitudinal axis; and
e) detecting radio frequency emissions from the subject nuclei in the volume $V_b$.

Where, in this specification the term "homogeneous magnetic field" is used, it is to be given the meaning a sufficiently homogeneous magnetic field so as to enable NMR excitation of a sufficient volume of sample and to provide an analysable NMR signal in that region.

Other aspects of the invention may become apparent from the following description which is given by way of example only and with reference to the accompanying drawings.

Where in the foregoing description reference has been made to elements or integers having known equivalents, then such equivalents are included as if they were individually set forth.

Although the invention has been described by way of example and with reference to particular embodiments, it is to be understood that modifications and/or improvements may be made without departing from the scope or spirit of the invention.

BRIEF DESCRIPTION OF THE DRAWINGS

The invention will now be described by way of example only and with reference to the drawings in which:

FIG. 4b: illustrates the field produced by the array of FIG. 4a.

FIG. 5b: illustrates the arrangement of FIG. 5a.

DETAILED DESCRIPTION OF PREFERRED FORMS

We have a number of objectives in the development of our system. Firstly we wish to reduce the cost of employing an expensive permanent magnet in portable NMR apparatus applications and secondly we wish to use our magnetic arrangement to study a substrate in the region below the surface. In the preferred embodiments, we achieve this by a unique arrangement of cylindrical magnets. As will be discussed in detail below, this arrangement involves the use of a plurality of cylindrical magnets, arranged to approximate a single ring magnet. Preferably, the magnets are tilted to provide to a cone shaped configuration.

Magnet Array

The starting point for our magnetic arrangement or array involves a replacement of a single ring magnet with a series of cylindrical magnets. These provide an approximation to the ring magnet and have the important advantage that standard "off the shelf" cylindrical magnet can be used. This is a far cheaper way of approaching the problem.

Figure 1:
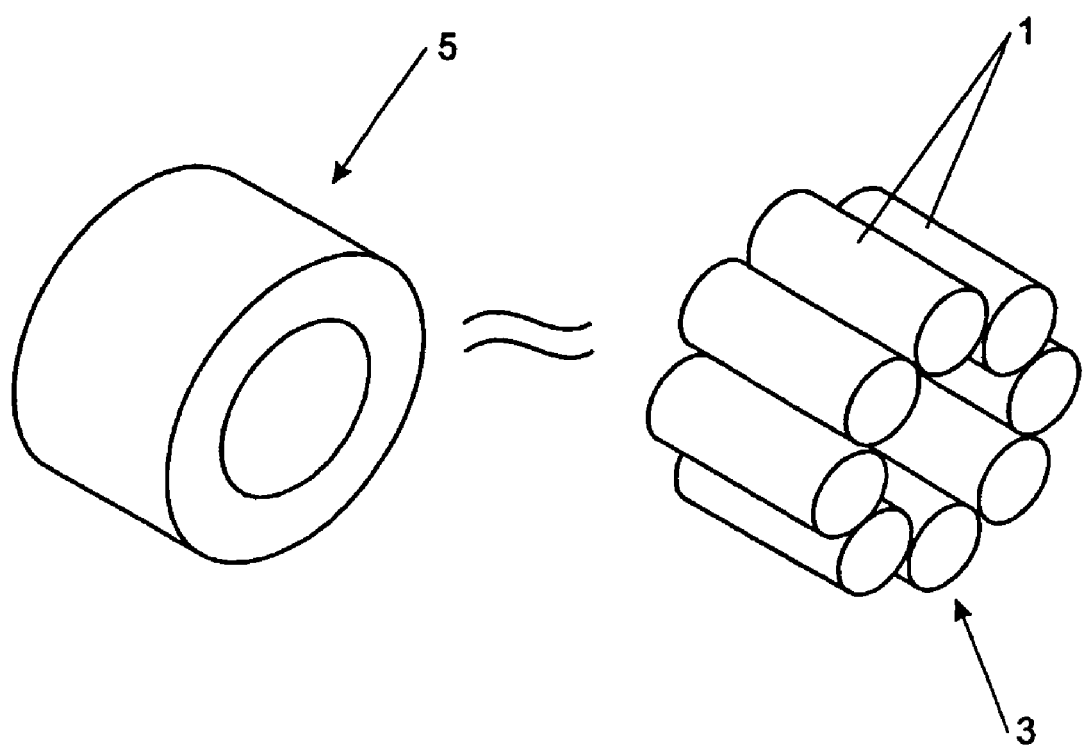
FIG. 1: Illustrates the approximation of a cylindrical ring magnet by an array of cylindrical bar magnets.

FIG. 1 is a schematic illustrating the use of plurality of cylindrical primary permanent magnets 1 in a magnetic assembly 3 to approximate a single permanent ring magnet 5.

To provide a good approximation of a solid ring, the individual magnets need to be as close as possible.

Homogeneity

There are a number of considerations in regard to obtaining a homogeneous field.

The field produced from a small array of magnets will never be perfectly homogeneous, so there needs to be a way of characterising the field's homogeneity. This can be done by looking at the Taylor expansion of the field at the point a.

$$B_{Taylor}(z) = c_0 + c_1(z-a) + c_2(z-a)^2 + c_3(z-a)^3 + c_4(z-a)^4 + \ldots$$

$$c_n = \frac{B^{(n)}(a)}{n!}$$

where $B^{(n)}$ is the nth derivative of B. The expression $B_{Taylor}(z)$ describes the field in a region around the point a. The $c_0$ coefficient gives the strength of the field and the coefficients $c_1, c_2, \ldots$ describe the inhomogeneity in the region. The first non-zero term will always be the dominant one that destroys the homogeneity. By manipulating the source of the field so that the first few coefficients are zero, a quasi-uniform field will result.

The well-known configuration of 'Helmholtz coils' does exactly that. Due to symmetry, the odd coefficients are zero but also the second order term. This leaves us with the first non-zero term $c_4$ so we have 'fourth order' field.

Figure 2:
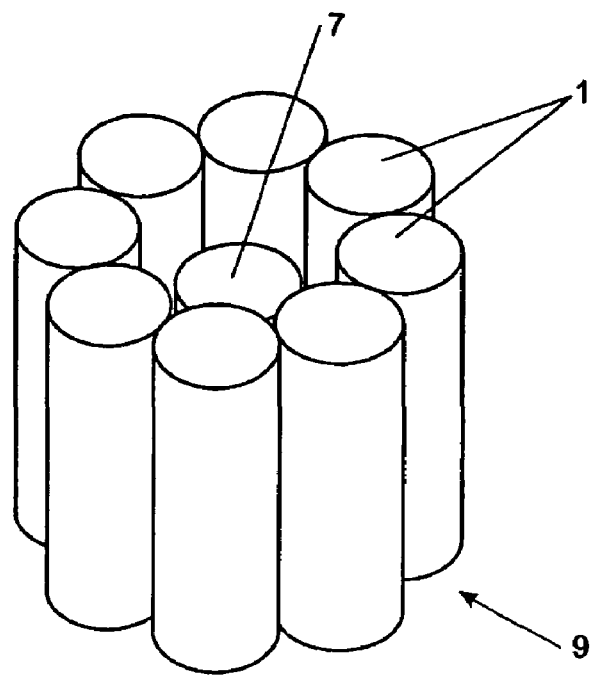
FIG. 2: illustrates the array of FIG. 1 with a central magnet to provide greater field homogeneity.

To generate a remote field of sufficient homogeneity we use a magnetic assembly 9 having a series of cylindrical magnets 1 arranged in a ring with a single permanent magnet 7 in the middle as illustrated in FIG. 2. The dimensions of magnets that make up the ring, and the number of magnets can be varied. The dimensions of the middle magnet can also be varied, but the position is determined by the 'homogeneity condition', that is, there is one specific placement of the central magnet which results in there being one point on the z-axis (or longitudinal axis) where the $1^{st}$ and $2^{nd}$ derivatives are zero.

It is preferable that the position of the central magnet relative to the array of surrounding magnets is adjustable. Adjustment of the central magnet along the z-axis relative to the array of primary magnets is particularly useful when taking measurements in concrete which contains reinforcing mesh. In the case of reinforcing steel in concrete, even if the magnet array is placed symmetrically above or in line with a square of the mesh (rather than above or in line with an intersection of wires), the distortion of the field is such that the homogeneity will be lost. However, if the assembly allows for ready adjustment of the position of the central magnet along the z-axis, the homogeneity can be restored. It has been found that the homogeneity can be restored by moving the central magnet by about 1-2 mm along the z-axis in an apparatus having dimensions similar to those outlined in the following calculation.

Example Homogeneity Calculation

Figure 3:
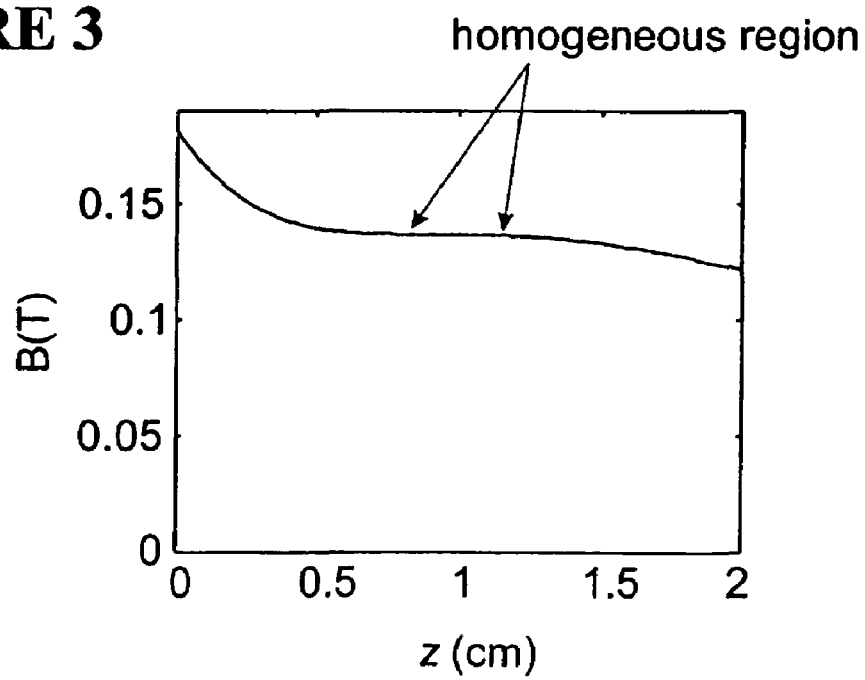
FIG. 3: illustrates the field produced by the array of FIG. 2.

For example, we choose 8 magnets with magnetisation 1.20 T, length 4.00 cm, radius 1.00 cm and arranging them axially in a cylinder about the z-axis so they are as close as possible. If we place a central magnet of the same dimensions in the middle, the homogeneity condition if the central magnet is placed at z=−2.62 cm. This gives a depth of 0.91 cm and a strength of 0.137 T, as illustrated in FIG. 3. FIG. 3 is a graph illustrating the homogeneous region obtained from a ring with a central magnet as shown in FIG. 2.

Arrangement of the Magnets in the Array

A further advantage of the use of a plurality of cylindrical magnets is that these can be angled inwards or outwards to give a distinctive cone shape. This is the second important feature of our apparatus.

FIG. 4 is a schematic illustrating the tilting of the primary magnets 1 of the array to provide a cone shape. The outer magnets that make up the ring in the magnetic assembly 11 are tilted by an angle β to give the "cone shape".

Tilted Ring Design

The strength and depth achieved by a ring will depend on the size of the magnets and the angle at which they are tilted. Greater depths are achieved when the magnets are tilted outwards, i.e. β is positive.

Figure 9:
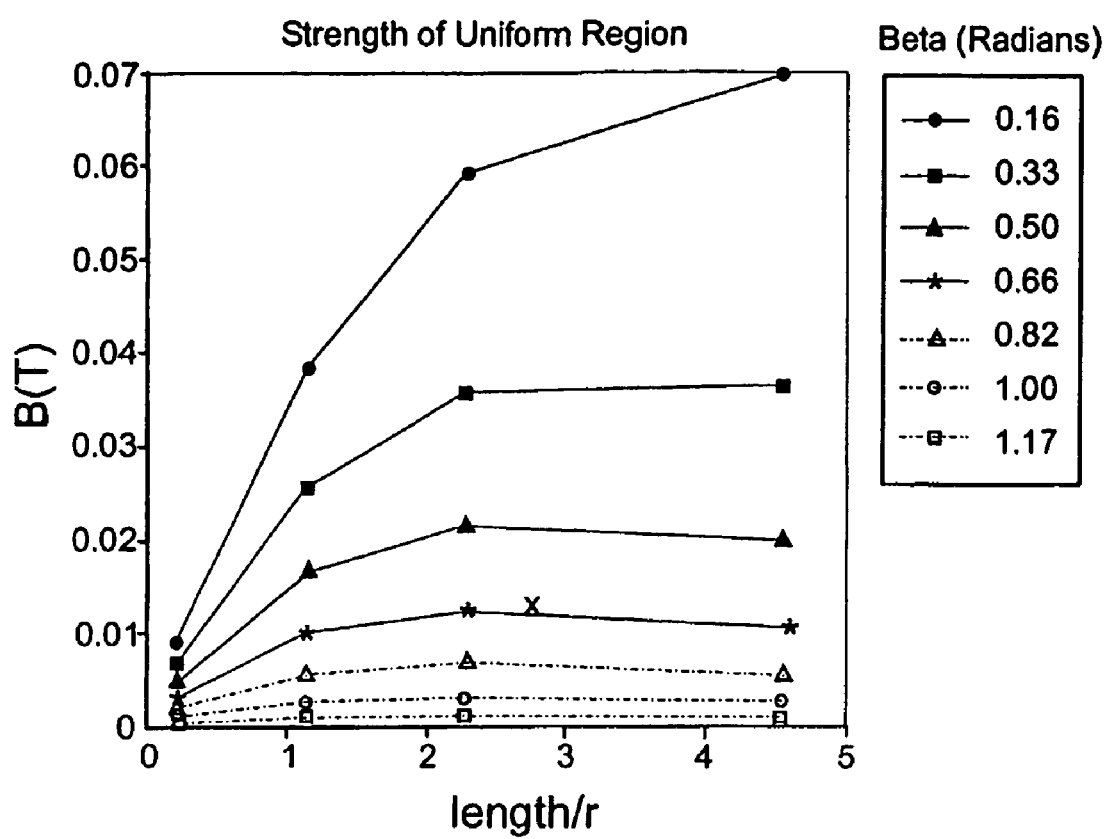
FIG. 9: illustrates strength of uniform region.
Figure 10:
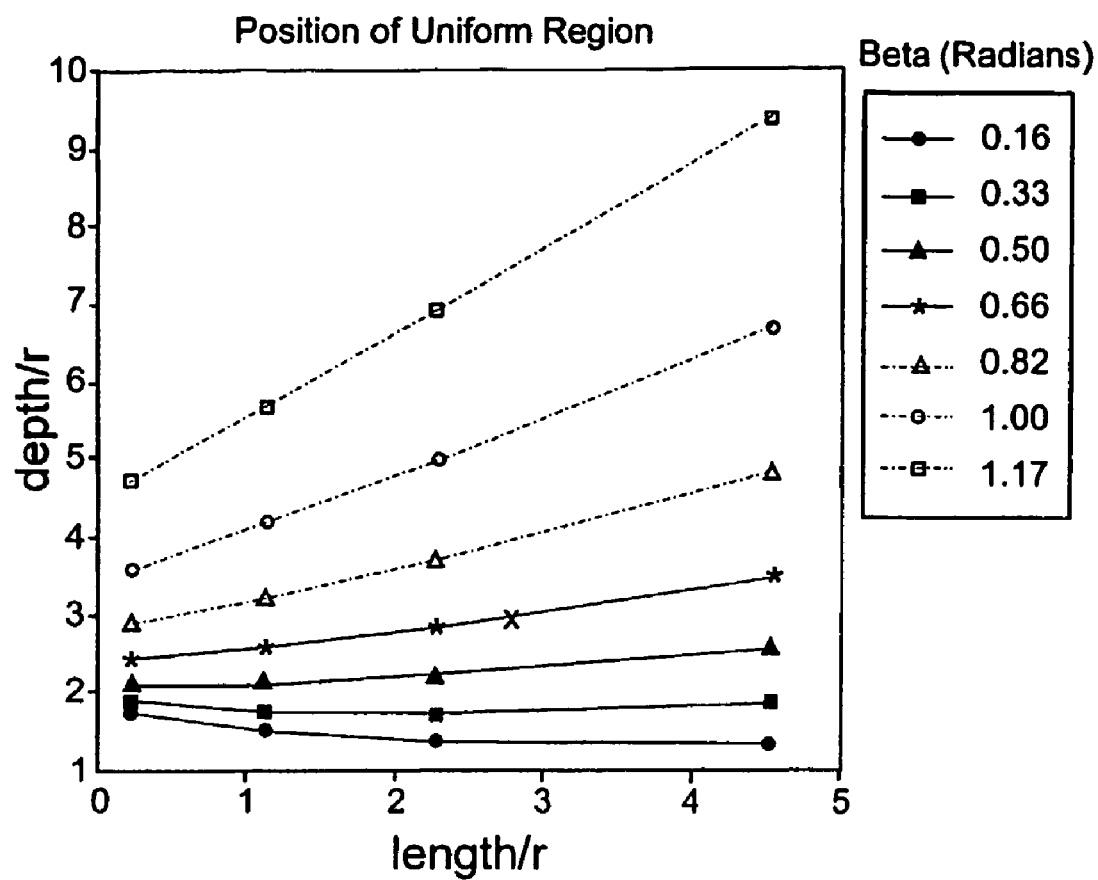
FIG. 10: illustrates position of uniform region.

It is useful to describe the size of array in a dimensionless form using the radius, r, as the scaling parameter. FIGS. 9 and 10 show the strength of the uniform region and the scaled depth of this region for different angles (the magnets are tilted outwards) and different scaled lengths.

It is apparent that as the angle β increases, the strength of the uniform region goes down and the depth goes up and appears to be a direct trade off. Angles between 0.33 and 0.82 Radians appear suitable. The most favourable length to radius ratio is not immediately clear, values between 2 and 4 contain a maximum in FIG. 9 through most angles and seem the best choice. At most angles, the strength decreases slightly above a length/r ratio of approximately 2.5. It can be seen from FIG. 10 that once β is larger than 0.5, the depth increases with a length/r as well.

The dimensions stated in the "Design Example" below are shown as an "x" in both graphs.

While not essential, it is preferable to construct the magnet ring in such a way that the outside magnets are as close as they can be. Because the 'depth' refers to the distance from the homogeneous region to the magnet, it makes sense to place the magnet array so that the top of the magnets are at z=0. Both of these conditions are met if the magnets are arranged as illustrated in FIG. 4a.

Figure 4A:
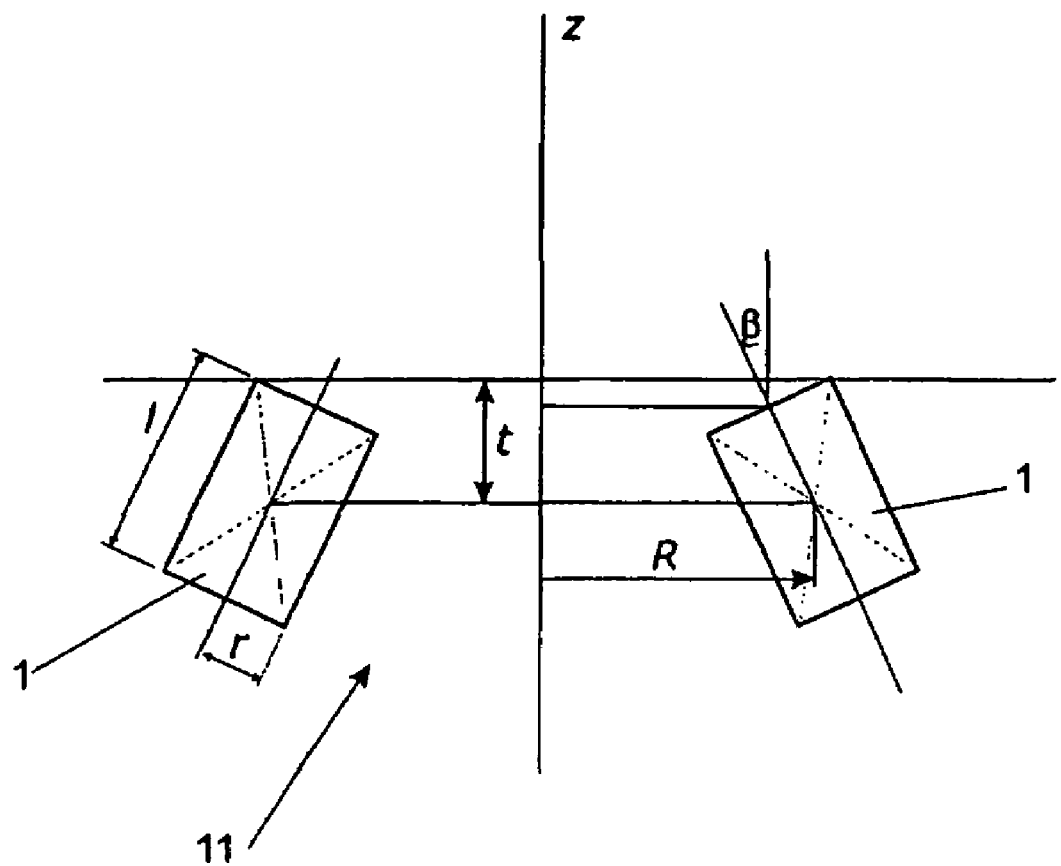
FIG. 4a: illustrates tilting of the outside magnets (cross sectional view).

With reference to FIG. 4a, to ensure that the top of the ring is at z=0 and that the magnets are as close as they can be, R and t are calculated as follows:

$$R = r|\cos\beta|\sqrt{1 + \frac{1}{\tan^2\frac{\pi}{N}\cos^2\beta}} + |l\sin\beta|$$

$$t = \sqrt{r^2 + \left(\frac{l}{2}\right)^2} \max(|\cos(\beta - \phi)|, |\cos(\beta + \phi)|)$$

where $$\phi = \tan^{-1}\left(\frac{2r}{l}\right)$$

N is the number of magnets used,
r is the radius of the magnets
l is the length of the magnets
β is the 'cone angle'
R is the 'ring radius' and
t is the distance along the z-axis from the front of the array to the geometric centres of the magnets.

Figure 4B:
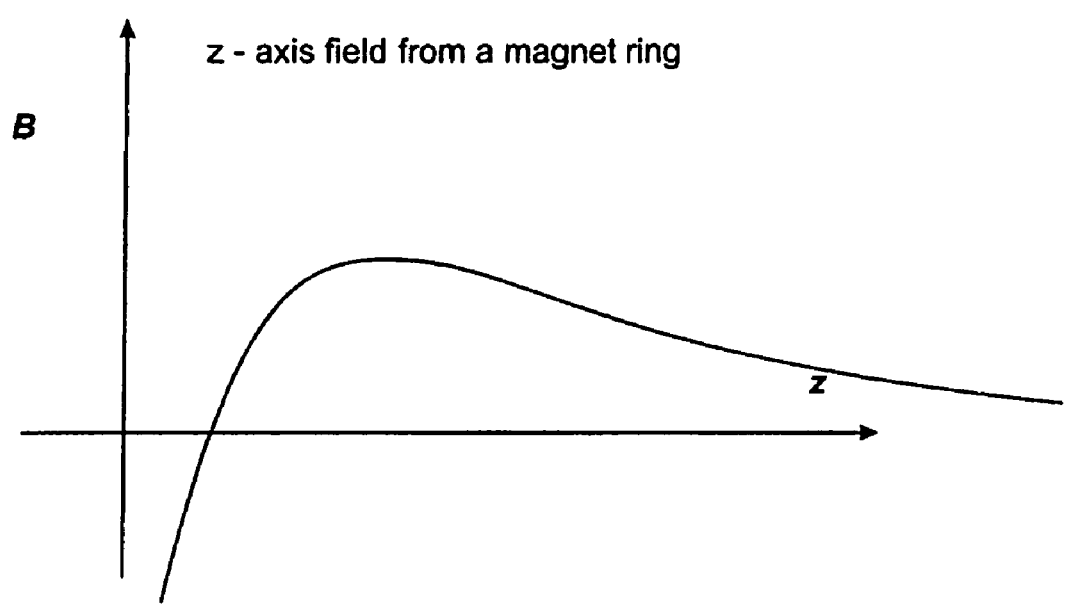

FIG. 4b illustrates the resultant z-axis field profile.

Figure 5A:
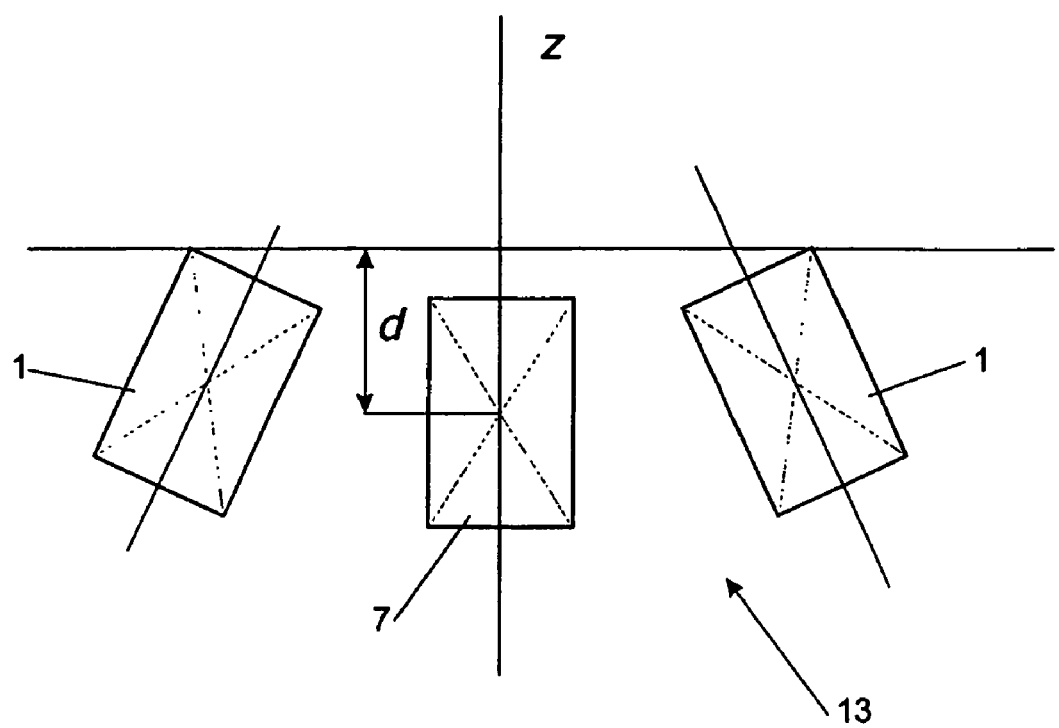
FIG. 5a: illustrates the use of a central magnet in the array of FIG. 4a (cross sectional view).
Figure 5B:
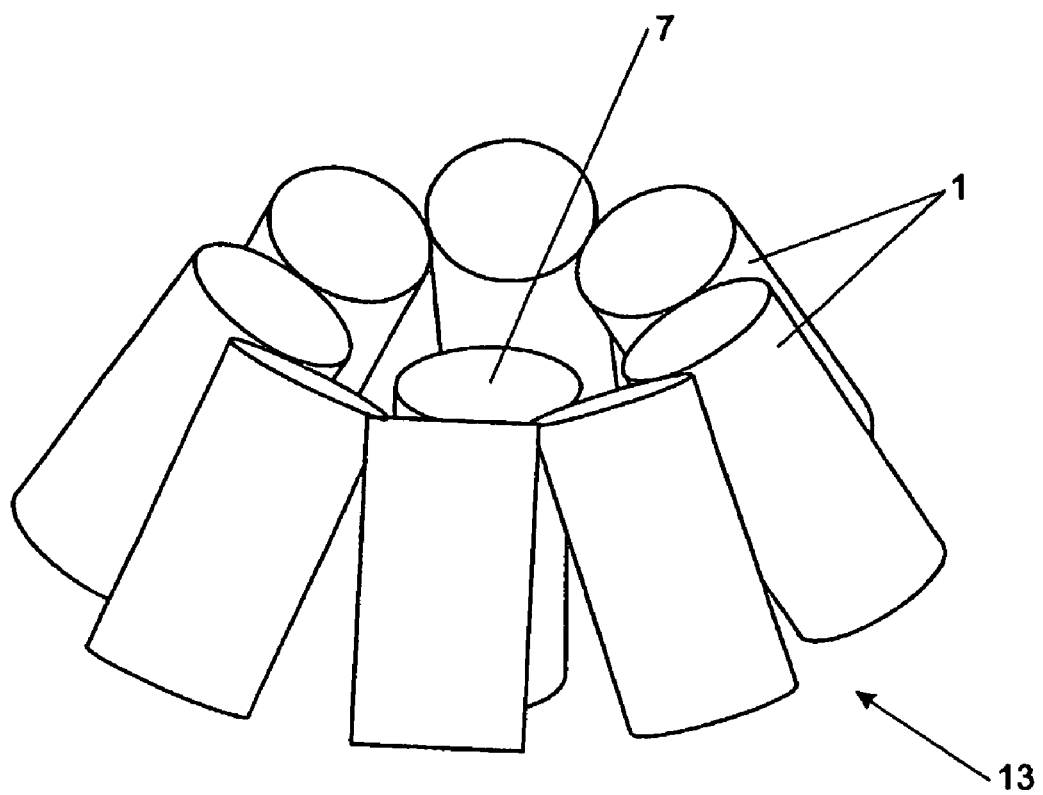
Figure 6:
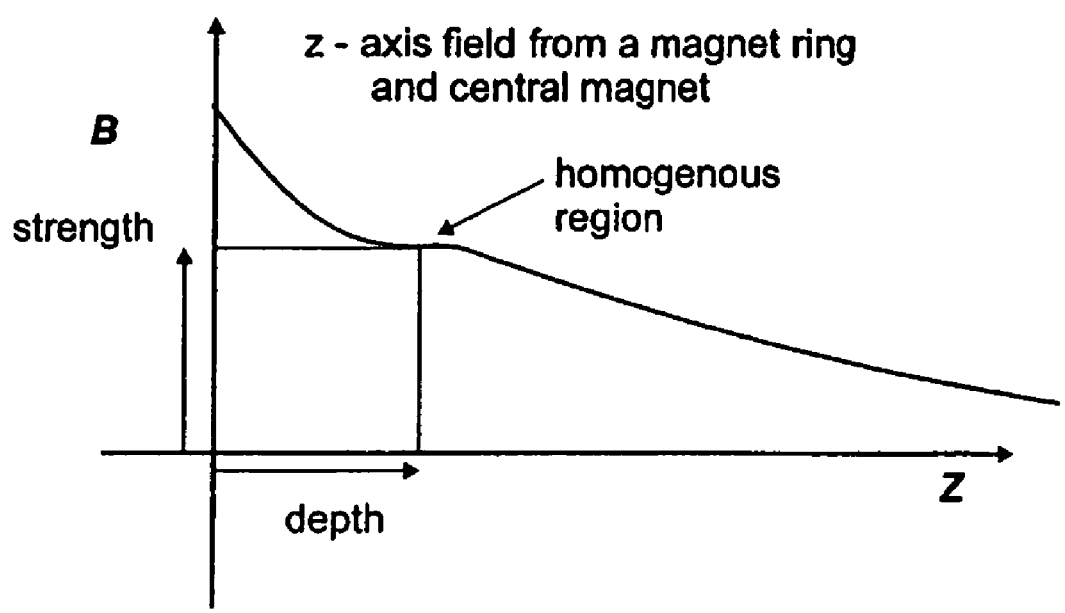
FIG. 6: illustrates the field produced by the arrays of FIGS. 5a and 5b.

FIGS. 5a and 5b illustrates a magnetic assembly 13 having a cone shaped array of primary magnets 1 with a central magnet 7. The central magnet is placed so that there is a homogeneous region at some z. FIG. 6 illustrates the z-axis field profile for such an arrangement.

For every ring configuration there is a position for the central magnet that will give a homogeneous region as described above. The other parameters, number of magnets, length and radius etc can be adjusted to optimise the depth of the homogenous region or the strength.

Therefore, in general the design of the invention involves placing a number of similar magnets in a ring at some angle (β), and the placing of another magnet in the middle so that there is one point on the z-axis where the 1$^{st}$ and 2$^{nd}$ derivative of the field is zero. This gives a homogenous region.

Design Example

Various designs involve magnets of different sizes, rings of various numbers of magnets and cones with various angles. All of these will produce a homogeneous region of a particular field strength and at a particular depth. For a one sided access-NMR application, a field strength of 0.01 T might be required. This can be realised with an array of magnets as shown below:
r=1.80 cm
l=5.00 cm
β=37.2°
N=8

This gives
R=6.09 cm
t=3.05 cm and the central magnet (of the same dimensions) at z=−3.27 cm (distance to the centre of the central magnet).

Figure 7:
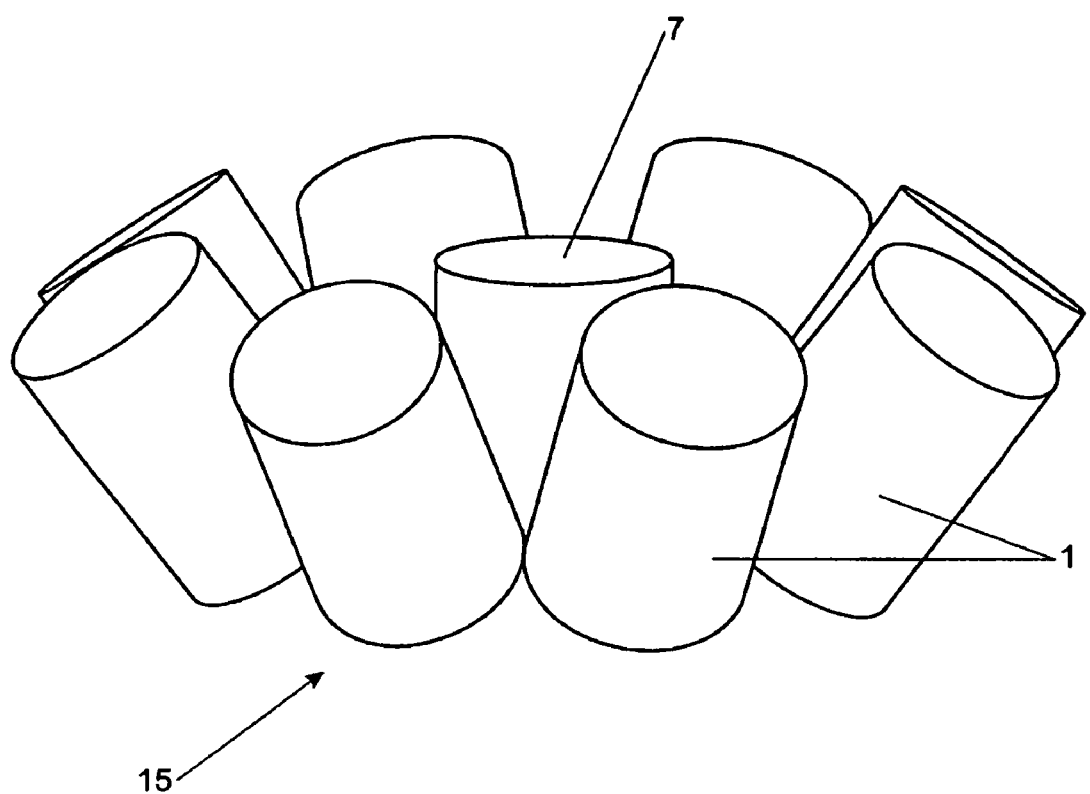
FIG. 7: illustrates preferred array of the example that will give a homogenous region at a depth of 5.25 cm with a field strength of 0.0127T.
Figure 8:
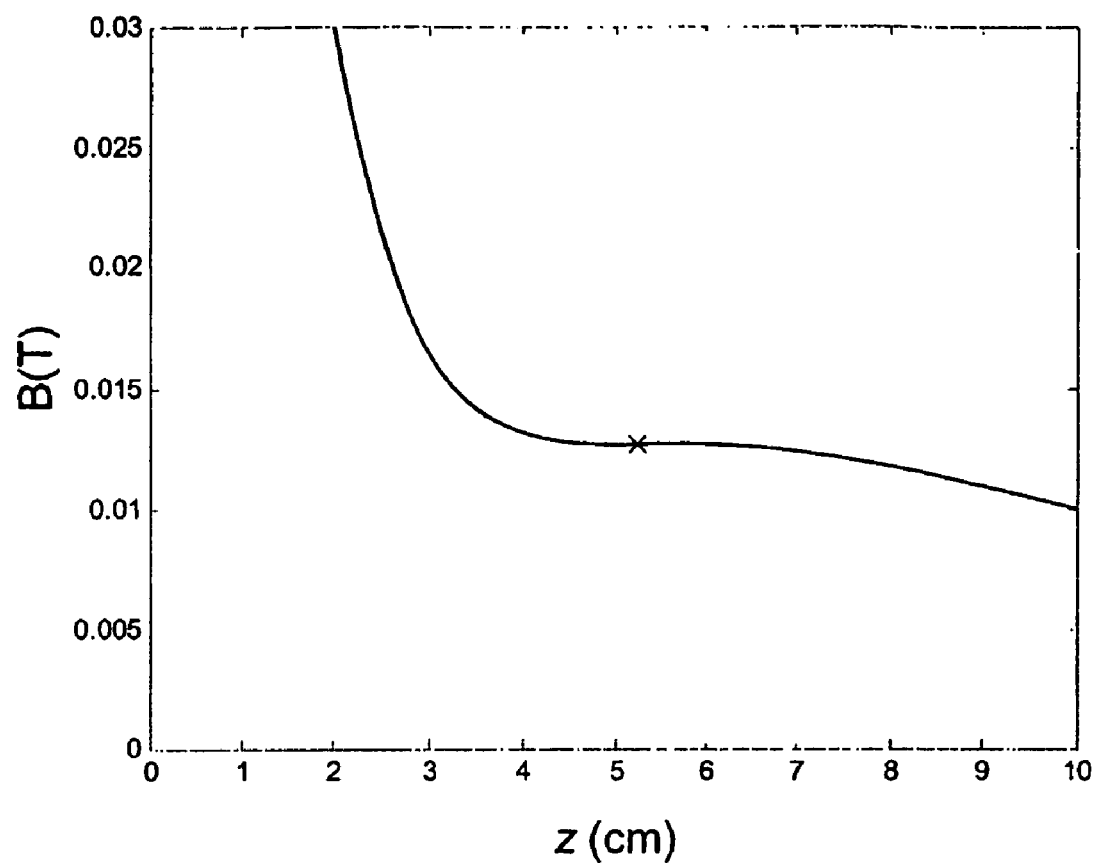
FIG. 8: illustrates magnetic field at distance Z for the array of FIG. 7.

The homogenous region is at z=5.25 cm with a field strength 0.0127 T. FIG. 7 shows a magnetic assembly 15 having a magnet array that will provide a homogeneous region at a depth of 5.25 cm with a field strength of 0.0127T. The field is illustrated in FIG. 8. The uniform region is centred around the "x" in the Figure.

Depth Considerations:

The depth of the subject area, into a sample, that can be studied depends upon (assuming a constant number of magnets) the angle, β, the length to radius ratio and the required field strength.

With reference to the above example, if β was kept constant and the length to radius ratio was increased, the depth would also increase, as shown in FIG. 10. It is important to note that the strength of the B field will start to decrease as the length to radius ratio gets larger than about 2.7, as shown in FIG. 9.

In practice, the depths we will be dealing with are up to 10 cm. In general, if the angle and the ratio are fixed, the depth will scale with the size of the magnets, i.e. double the dimensions of the magnets, double the depth.

Figure 11:
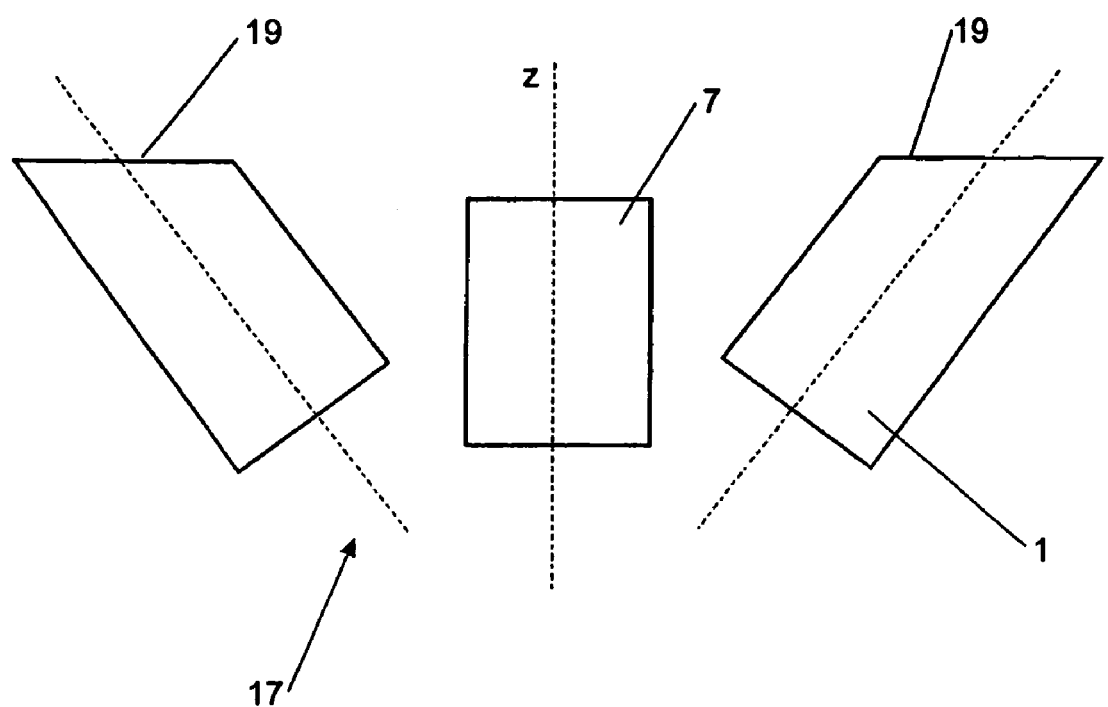
FIG. 11: illustrates a modified form of the invention in which the faces of the magnets are truncated to sit flush with the surface of the material to be analysed.

FIG. 11 shows a modified magnetic apparatus 17 in which the faces 19 of the array of magnets 1 are truncated, so that the faces 19 of the magnets can sit flush with the surface of the material to be analysed. This improves the efficiency of the apparatus, due to reduced spacing between the magnets and the material.

Excitation of Separate "Slices" or "Volumes"

The direct relationship between magnetic field intensity and NMR frequency means that the field profile associated with the magnet configurations described here necessarily corresponds to a frequency profile for the nuclear spins being excited in the NMR measurement. In particular, the range of frequencies present in the excitation pulse (the pulse bandwidth) will determine the spatial range of spins excited in the region of nearly uniform magnetic field. This bandwidth is in turn limited by the rf power available in the transmitter. Thus the largest region of spins, and hence the strongest signal will be obtained, when the rf power is at a maximum.

The relationship between rf pulse power and field uniformity thus determines the spatial extent of the region of sample excited in the NMR measurement and also the size of the signal measured and hence the intrinsic sensitivity of the experiment.

Repetition of the rf excitation pulse, and hence the sensitivity advantage which comes from repeating and adding many independently acquired signals (signal averaging) is limited by the need for the nuclear spins to relax back to thermal equilibrium, a process which takes on the order of 0.1 s to 10 s, depending on the sample.

To further increase the signal sensitivity or to further extend the region of sample from which the signal is acquired, the technique of successively switching the transmitter and receiver frequencies on successive excitations and acquisitions will be effective. With each successive excitation, the rf excitation frequency will be changed so as to excite a contiguous slice, cyclically stepping the region of spins excited through adjacent slices. Provided that the total time allowed before repeating excitation on the same slice is sufficient for relaxation, this process may be take place rapidly with successive slices being examined in times much less than the relaxation time. In this way the fundamental efficiency of the measurement is improved. Furthermore by suitable multiplexing, information from different spatial regions may be separated to give spatial profiling.

This switching technique depends on switching the tuning frequency of the rf coils, a technique which depends on electronic switching between differing tuning elements (capacitors).

Accordingly, the apparatus is preferably arranged to generate a sufficiently homogeneous magnetic field over a volume $V_a$ located at a location along the z-axis in the material thereby causing excitation of subject nuclei in the volume $V_a$, and to detect radio frequency emissions from the subject nuclei in the volume $V_a$. The apparatus is preferably arranged to, substantially immediately following excitation of volume $V_a$, cause excitation of subject nuclei in a volume $V_b$, wherein $V_b$ is a volume differing from $V_a$ only in its position along the longitudinal axis, and to detect radio frequency emissions from the subject nuclei in the volume $V_b$.

Applications:

The NMR apparatus of the invention has a large number of applications. The preferred embodiment employs a number of "off the shelf" cylindrical magnets which can be any of a number of proportions. It is envisaged the most common of these will be smaller magnets to provide a portable NMR Probe for various applications (however, the invention is not restricted to portable probes).

All applications will include the use of such apparatus to study liquid phases (whether in a solid phase, or within other liquid phases). Such applications include moisture studies. Specific examples are:

moisture content of soil;
  moisture levels in buildings;
  moisture content of timber and logs;
  location of knots and defects in timber and logs;
  drug detection in humans;
  in-vivo spectroscopy on humans and animals;
  moisture analysis of packaged food.

One particular example is the application of the probe to studies of the curing of concrete as outlined below.

EXAMPLE

Concrete is a mixture of water, cement, sand and gravel. The water is contained in three different states, chemically bound, capillary bound and free water. During the curing process, the relative fraction of these three states changes as water evaporates from the surface. The moisture content of the concrete gives an indication of its strength and readiness to accept floor coverings. Presently there is no reliable way of measuring this.

The one sided access NMR probe of the preferred embodiment of the invention provides a convenient way of measuring the moisture. One part of such a probe is achieving a homogenous magnetic field $B_0$ at a useful depth of approximately 5 cm.

Where in the foregoing description reference has been made to elements or integers having known equivalents, then such equivalents are included as if they were individually set forth.

Although the invention has been described by way of example and with reference to particular embodiments, it is to be understood that modifications and/or improvements may be made without departing from the scope or spirit of the invention.

For example, the magnet elements need not be cylinders but perhaps some other convenient shape. The arrangement of the elements will preferably be such that their magnetisations form a "cone-shape" at some angle (i.e. the axis between the north and south poles within the magnet is at a non-parallel angle to the longitudinal axis), and it is this angle that will determine the position of the central magnet such that the homogeneity condition is met. However, it should be noted that the expressions for R and t above only apply to cylindrical magnets. As an example, an array could be constructed out of blocks which are aligned with the axis, but the magnetisation of each block in the array could be arranged so that the array forms the "cone-shape".

The preferred apparatus are described as having 8 primary magnets in the array. More or less magnets could be used as desired. However, an array of 8 magnets has been found to provide good coverage of magnetic material.

The invention claimed is:

1. A magnetic assembly for an NMR apparatus, comprising a plurality of primary permanent magnets disposed in an annular array about an axis (hereafter "longitudinal axis"), wherein each of the primary magnets has a north and a south pole with an axis extending therebetween, and each of the primary magnets is arranged such that its axis is oriented at a non-parallel angle to the longitudinal axis of the assembly, the assembly further comprising a secondary permanent magnet located on the longitudinal axis, at a position at least partly within the array of primary magnets, the non-parallel angles of the primary magnet axes and the position of the secondary magnet are selected to create a zone of homogeneous magnetic field at a location along the longitudinal axis forward of the array and into a material when provided.

2. A magnetic assembly as claimed in claim 1, wherein the position of the secondary permanent magnet is adjustable along the longitudinal axis relative to the primary magnets.

3. A magnetic assembly as claimed in claim 2, wherein the secondary magnet is a cylindrical bar magnet.

4. A magnetic assembly as claimed in claim 2, wherein the secondary magnet is positioned such that the first and second spatial derivatives of the magnetic field are zero at some coincident location along the longitudinal axis forward of the array (and into the material when provided).

5. A magnetic assembly as claimed in claim 1, wherein each of the plurality of primary magnets is a cylindrical bar magnet, each having a proximal end at a front of the array, and a distal end at a rear of the array.

6. A magnetic assembly as claimed in claim 5, wherein each of the plurality of primary magnets is tilted at an angle relative to the longitudinal axis, such that the configuration of magnets is in a substantially symmetrical tapered arrangement.

7. A magnetic assembly as claimed in claim 6, wherein the tapered arrangement is according to the expression:

$$R = r|\cos\beta| \sqrt{1 + \frac{1}{\tan^2 \frac{\pi}{N} \cos^2\beta}} + l|\sin\beta|$$

-continued $$t = \sqrt{r^2 + \left(\frac{l}{2}\right)^2} \max(|\cos(\beta - \phi)|, |\cos(\beta + \phi)|)$$

where $$\phi = \tan^{-1}\left(\frac{2r}{l}\right)$$

N is the number of magnets used,
r is the radius of the magnets,
l is the length of the magnets,
β is the 'cone angle',
R is the 'ring radius',
and t is the distance along the longitudinal axis from the front of the array to the geometric centre of the magnets.

8. A magnetic assembly as claimed claim 6 or 7, wherein the proximal end of each of the plurality of primary magnets is tilted through an angle beta towards the longitudinal axis, such that the configuration of primary magnets is in a substantially symmetrical tapered arrangement, tapering towards the front of the array.

9. A magnetic assembly as claimed in claim 6 or 7, wherein the proximal end of each of the plurality of primary magnets is tilted through an angle beta away from the longitudinal axis, such that the configuration of primary magnets is in a substantially symmetrical tapered arrangement, tapering away from the front of the array.

10. A magnetic assembly as claimed in claim 1, wherein the plurality of primary magnets is disposed substantially symmetrically about the longitudinal axis.

11. A magnetic assembly as claimed in claim 1, wherein the primary magnets are as close together as is physically or reasonably possible.

12. A magnetic assembly as claimed in claim 1, wherein each of the plurality of primary magnets is substantially identical.

13. A magnetic assembly as claimed in claim 12 wherein the secondary magnet is of substantially identical dimensions to each of the plurality of primary magnets.

14. A magnetic assembly as claimed in claim 13, wherein each of the plurality of primary magnets and the secondary magnet is a cylindrical bar magnet having a radius of about 1.8 cm and a length of about 5 cm.

15. A magnetic assembly as claimed in claim 1, comprising eight primary magnets.

16. A nuclear magnetic resonance apparatus for one sided access investigations of a material, comprising a magnetic assembly as claimed in claim 1.

17. A nuclear magnetic resonance apparatus as claimed in claim 16, wherein the nuclear magnetic resonance apparatus is portable.

18. A nuclear magnetic resonance apparatus as claimed in claim 16, operable to provide investigations into a sample at up to about 10 cm.

19. A nuclear magnetic resonance apparatus as claimed in claim 16, wherein the apparatus is operable in such a fashion as to allow excitation of one volume $V_a$ of the material, being one of a plurality of volumes $V_1$ to $V_n$ existing as slices along the longitudinal axis.

20. A nuclear magnetic resonance apparatus as claimed in claim 19, wherein the apparatus is operable to, following excitation of $V_a$ then allow excitation of a second volume $V_b$ being one of the plurality of volumes $V_1$ to $V_n$ substantially immediately after excitation of $V_a$ without moving the apparatus, by varying an excitation frequency of the apparatus.

21. A method of studying the magnetic resonance of a material comprising the steps of:
  a) employing an NMR apparatus as claimed in claim 16;
  b) generating a sufficiently homogeneous magnetic field over a volume $V_a$ located at a location along the longitudinal axis in the material thereby causing excitation of subject nuclei in the volume $V_a$; and
  c) detecting radio frequency emissions from the subject nuclei in the volume $V_a$.

22. A method of studying the magnetic resonance of a material as claimed in claim 21, comprising, subsequent to step c):
  d) substantially immediately following excitation of volume $V_a$, causing excitation of subject nuclei in a volume $V_b$, wherein $V_b$ is a volume differing from $V_a$ only in its position along the longitudinal axis, wherein said excitation of volume $V_b$ occurs without moving the apparatus from the position in which volume $V_a$ is excited, by varying an excitation frequency of the apparatus; and
  e) detecting radio frequency emissions from the subject nuclei in the volume $V_b$.

23. A nuclear magnetic resonance apparatus for one sided access investigations of a material, comprising a plurality of primary permanent magnets disposed in an annular array about an axis (hereafter "longitudinal axis"), and a secondary permanent magnet located on the longitudinal axis, at least partly within the array of primary magnets, the position of the secondary permanent magnet being adjustable along the longitudinal axis relative to the primary magnets, to create a zone of homogeneous magnetic field at a location along the axis forward of the array and into a material when provided.

* * * * *

UNITED STATES PATENT AND TRADEMARK OFFICE
CERTIFICATE OF CORRECTION

PATENT NO. : 7,391,215 B2  Page 1 of 1
APPLICATION NO. : 10/520862
DATED : June 24, 2008
INVENTOR(S) : Callaghan et al.

It is certified that error appears in the above-identified patent and that said Letters Patent is hereby corrected as shown below:

Title Page, Item (73) Assignees, change "Victoria Link Limited, Kelburn, Wellington (NL); Massey University, Palmerston North (NL)" to -- Victoria Link Limited, Kelburn, Wellington (NZ); Massey University, Palmerston North (NZ) --

Signed and Sealed this

Fourth Day of August, 2009

JOHN DOLL
*Acting Director of the United States Patent and Trademark Office*